(12) United States Patent
Kim

(10) Patent No.: US 8,557,660 B2
(45) Date of Patent: Oct. 15, 2013

(54) SEMICONDUCTOR DEVICE AND METHOD FOR FORMING THE SAME

(75) Inventor: Sung Hyun Kim, Seoul (KR)

(73) Assignee: Hynix Semiconductor Inc., Icheon (KR)

( * ) Notice: Subject to any disclaimer, the term of this patent is extended or adjusted under 35 U.S.C. 154(b) by 174 days.

(21) Appl. No.: 12/650,203

(22) Filed: Dec. 30, 2009

(65) Prior Publication Data

US 2011/0024811 A1 Feb. 3, 2011

(30) Foreign Application Priority Data

Jul. 28, 2009 (KR) .................. 10-2009-0069068

(51) Int. Cl.
*H01L 21/336* (2006.01)
*H01L 29/66* (2006.01)

(52) U.S. Cl.
USPC ..... 438/259; 438/270; 257/330; 257/E27.084

(58) Field of Classification Search
USPC .......... 257/296, E21.616, E27.016, 262, 330, 257/332, 300, E27.074, E27.084; 438/288, 438/586, 259, 270, 445
See application file for complete search history.

(56) References Cited

U.S. PATENT DOCUMENTS

| | | | |
|---|---|---|---|
| 2003/0170955 A1* | 9/2003 | Kawamura et al. ........... | 438/270 |
| 2005/0196918 A1* | 9/2005 | Schwerin ..................... | 438/243 |
| 2006/0270153 A1* | 11/2006 | Lee .............................. | 438/253 |
| 2007/0123040 A1* | 5/2007 | Hwang et al. ................ | 438/672 |
| 2007/0267676 A1* | 11/2007 | Kim et al. .................... | 257/311 |
| 2008/0023742 A1* | 1/2008 | Lee .............................. | 257/296 |
| 2008/0070394 A1* | 3/2008 | Uchiyama .................... | 438/586 |
| 2008/0160700 A1* | 7/2008 | Lee .............................. | 438/270 |
| 2008/0283957 A1* | 11/2008 | Kang et al. ................... | 257/499 |
| 2009/0114991 A1* | 5/2009 | Kim et al. .................... | 438/270 |

FOREIGN PATENT DOCUMENTS

| | | |
|---|---|---|
| KR | 1020060014672 A | 2/2006 |
| KR | 1020060124385 A | 12/2006 |
| KR | 1020080014503 A | 2/2008 |
| KR | 100843716 B1 | 6/2008 |
| KR | 1020080088918 A | 10/2008 |

\* cited by examiner

*Primary Examiner* — Daniel Luke
*Assistant Examiner* — Khaja Ahmad

(57) ABSTRACT

A method for forming a semiconductor device is disclosed. The method for forming the semiconductor device includes forming a pad insulating layer on a semiconductor substrate, forming a recess by etching the pad insulating layer and the semiconductor substrate, forming a buried gate buried in the recess, forming an insulating layer for defining a bit line contact hole over the buried gate and the pad insulating layer, forming a bit line over a bit line contact for filling the bit line contact hole, and forming a storage electrode contact hole by etching the insulating layer and the pad insulating layer to expose the semiconductor substrate. As a result, the method increases the size of an overlap area between a storage electrode contact and an active region without an additional mask process, resulting in a reduction in cell resistance.

7 Claims, 8 Drawing Sheets

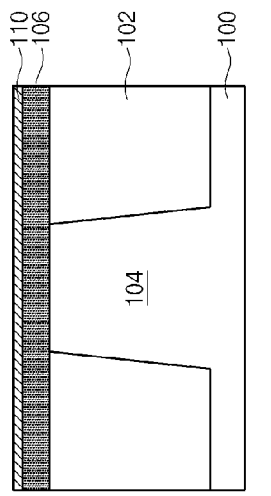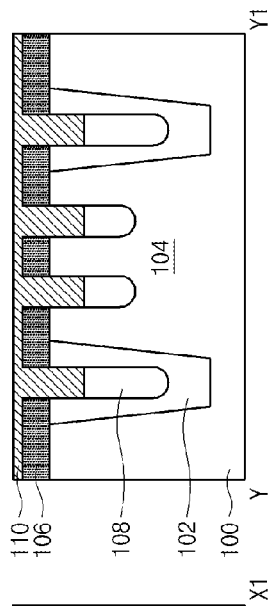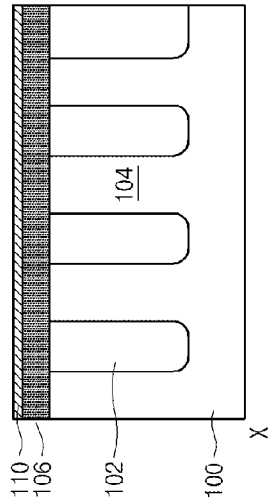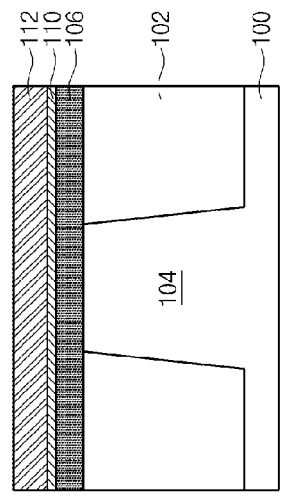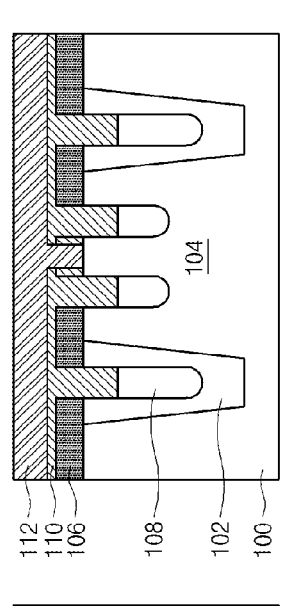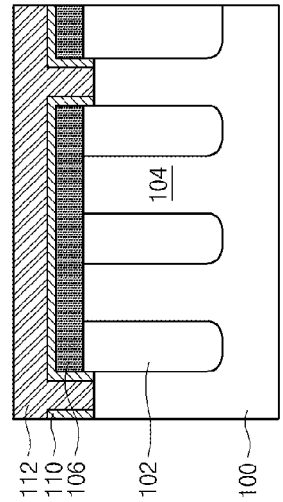
Fig.3a
Fig.3b

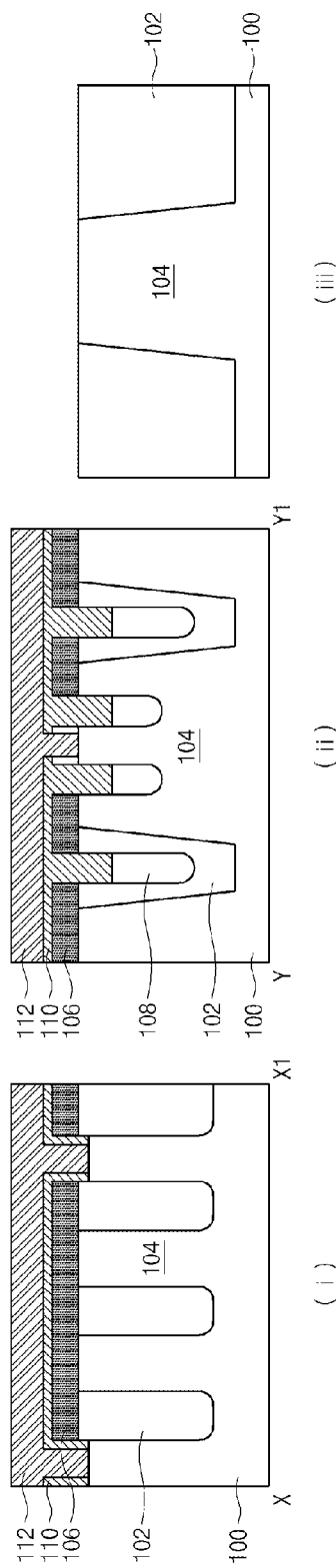
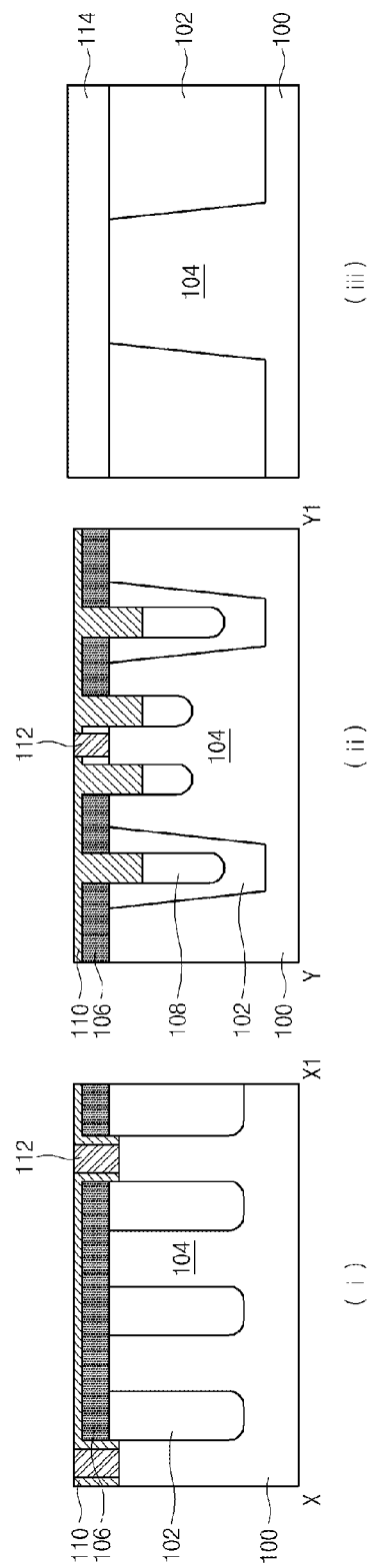
Fig.3c
Fig.3d

SEMICONDUCTOR DEVICE AND METHOD FOR FORMING THE SAME

CROSS-REFERENCE TO RELATED APPLICATION

The priority of Korean patent application No. 10-2009-0069068 filed on Jul. 28, 2009,the disclosure of which is hereby incorporated in its entirety by reference, is claimed.

BACKGROUND OF THE INVENTION

1.Field of the Invention

Embodiments of the present invention relate to a method for forming a semiconductor device, and more particularly to a method for forming a semiconductor device including a buried gate.

2.Background of the Invention

Recently, most electronic appliances include semiconductor devices. The semiconductor devices include electronic elements, such as transistors, resistors, capacitors, and the like. These electronic elements are designed to perform functions of the electronic appliances and are integrated on a semiconductor substrate. For example, electronic appliances, such as computers, digital cameras, and the like, include semiconductor devices, such as memory chips for storage of information, processing chips for control of information, and the like. The memory chips and processing chips include electronic elements integrated on a semiconductor substrate.

The semiconductor devices have a need for an increase in an integration degree thereof, in order to satisfy consumer demands for superior performances and low prices. Such an increase in the integration degree of a semiconductor device entails a reduction in a design rule, causing patterns of a semiconductor device to be increasingly reduced. Although an entire chip area is increased in proportion to an increase in a memory capacity as a semiconductor device is becoming extremely miniaturized and highly integrated, the size of a cell area where patterns of a semiconductor device are actually formed is decreased. Accordingly, since a greater number of patterns should be formed in a small cell area in order to achieve a desired memory capacity, there is a need for formation of microscopic patterns having a reduced critical dimension.

Nowadays, various method for forming microscopic patterns have been developed, including, e.g., a method using a phase shift mask as a photo mask, a Contrast Enhancement Layer (CEL) method in which a separate thin film capable of enhancing image contrast is formed on a wafer, or a Tri Layer Resist (TLR) method in which an intermediate layer, such as, e.g., a Spin On Glass (SOG) film, is interposed between two photoresist films.

Meanwhile, a contact for connecting upper and lower conductive lines to each other is significantly affected by a design rule, as compared to line and space patterns. In more detail, an increase in the integration degree of a semiconductor device causes a reduction in a size of a contact and an interval between the contact and the neighboring conductive line and consequently, causes an increase in an aspect ratio of the contact, that is, a ratio of a diameter to a depth of the contact. Therefore, a contact forming process holds an important position in a method for forming a highly integrated semiconductor device. Accordingly, in a highly integrated semiconductor device having multilayered conductive lines, a contact forming process may require a precise and strict mask alignment, entailing a reduction in process margin.

In particular, a Self Align Contact (SAC) fail occurs between a landing plug and a gate or between a landing plug and a recess gate in a landing plug process, resulting in a reduced production yield. Therefore, there is proposed an improved technology for changing the gate or the recess gate structure to a buried gate structure to prevent the SAC fail from occurring between the recess or the recess gate structure and the landing plug.

However, the buried gate structure also has a disadvantage in that it causes the SAC fail at a storage electrode contact or a bit line. SAC fail at a storage electrode contact occurs when the storage electrode contact is not connected to an active region.

BRIEF SUMMARY OF THE INVENTION

Various embodiments of the present invention are directed to a method for forming a semiconductor device that substantially obviates one or more problems due to limitations and disadvantages of the related art. An object of the present invention is to provide a method for forming a semiconductor including a buried gate, such that it prevents cell resistance from being increased in inverse proportion to the size of a connection area between a contact of a storage electrode and an active region.

In accordance with an aspect of the present invention, a semiconductor device includes a bit line formed on a semiconductor substrate including a device isolation layer; and a pad insulating layer formed under the bit line.

Preferably, the semiconductor device may further include a bit line contact formed on an active region defined by the device isolation layer, wherein the bit line contact is connected to the bit line.

Preferably, the semiconductor device may further include an insulating layer that is formed not only at an upper part of the pad insulating layer but also at sidewalls of the bit line contact.

Preferably, the pad insulating layer may be an oxide layer.

Preferably, the pad insulating layer may have a thickness of 500 Å to 700 Å.

Preferably, the insulating layer may be a nitride layer.

Preferably, the insulating layer may have a thickness of 150 Å to 250 Å.

Preferably, the semiconductor device may further include a buried gate buried in the semiconductor substrate.

Preferably, the semiconductor device may further include a spacer formed at sidewalls of the bit line.

Preferably, the semiconductor device may further include a storage electrode contact connected to the semiconductor substrate at sidewalls of the spacer.

Preferably, the storage electrode contact plug laterally extends at its lower part along the surface of the substrate towards the bit line, so that the lower part of the storage contact plug is wider than its upper part.

In accordance with another aspect of the present invention, a method for forming a semiconductor device includes forming a pad insulating layer on a semiconductor substrate, forming a recess by etching the pad insulating layer and the semiconductor substrate, forming a buried gate buried in the recess, forming an insulating layer for defining a bit line contact hole over the buried gate and the pad insulating layer, forming a bit line over a bit line contact for filling the bit line contact hole, and forming a storage electrode contact hole by etching the insulating layer and the pad insulating layer to expose the semiconductor substrate.

Preferably, the forming of the pad insulating layer may include forming an oxide layer having a thickness of 500 Å to 700 Å on the semiconductor substrate.

Preferably, the forming of the insulating layer may include forming a nitride layer having a thickness of 150 Å to 250 Å on the buried gate and the pad insulation layer.

Preferably, the forming of the bit line may include forming a conductive layer, a nitride layer, and a hard mask layer on the insulating layer including the bit line contact, forming a photoresist pattern for defining the bit line on the hard mask layer, and etching the hard mask layer, the nitride layer, and the conductive layer using the photoresist pattern as an etch mask to expose the insulating layer.

Preferably, the forming of the storage electrode contact hole may include forming an interlayer insulating layer on an entire upper surface, etching the interlayer insulating layer and the insulating layer to expose the pad insulating layer, forming a spacer at sidewalls of the insulating layer, sidewalls of the interlayer insulating layer, and sidewalls of the bit line, and etching the pad insulating layer using the spacer as an etch mask to expose the semiconductor substrate.

Preferably, the etching of the pad insulating layer may be further extended to a lower part of the insulating layer.

Preferably, the etching of the pad insulating layer may be performed by a wet etching process.

Preferably, the forming of the spacer may include forming a spacer material over an entire upper surface including the interlayer insulating layer and the bit line, and performing an etch-back process on the spacer material.

Preferably, the method may further include, after forming the storage electrode contact hole, filling the storage electrode contact hole with conductive material to form a storage electrode contact.

BRIEF DESCRIPTION OF THE DRAWINGS

FIGS. 2(i) to 2(iii) are cross-sectional views illustrating a semiconductor device according to embodiments of the present invention, FIG. 2(i) is a cross-sectional view illustrating a cell area taken along the line x-x' of FIG. 1, FIG. 2(ii) is a cross-sectional view illustrating a cell area taken along the line y-y' of FIG. 1, and FIG. 2(iii) is a cross-sectional view illustrating a peripheral area.

FIGS. 3a to 3h are cross-sectional views illustrating a method for forming a semiconductor device according to an embodiment of the present invention, each of FIG. (i) of FIGS. 3a to 3h is a cross-sectional view illustrating a cell area taken along the line x-x' of FIG. 1, each of FIG. (ii) of FIGS. 3a to 3h is a cross-sectional view illustrating a cell area taken along the line y-y' of FIG. 1, and each of FIG. (iii) is a cross-sectional view illustrating a peripheral area of FIGS. 3a to 3h.

DESCRIPTION OF EMBODIMENTS

Embodiments of the present invention are described below, examples of which are illustrated in the accompanying drawings. Wherever possible, the same reference numbers will be used throughout the drawings to refer to the same or like parts.

Figure 1:
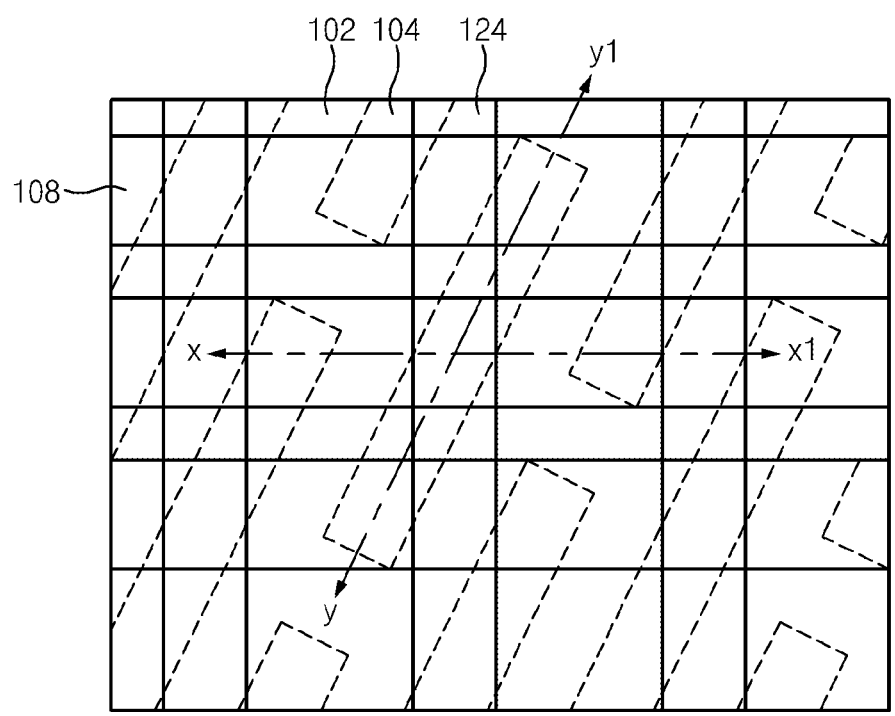
FIG. 1 is a plan view illustrating a cell area of a semiconductor device according to an embodiment of the present invention.
Figure 2:
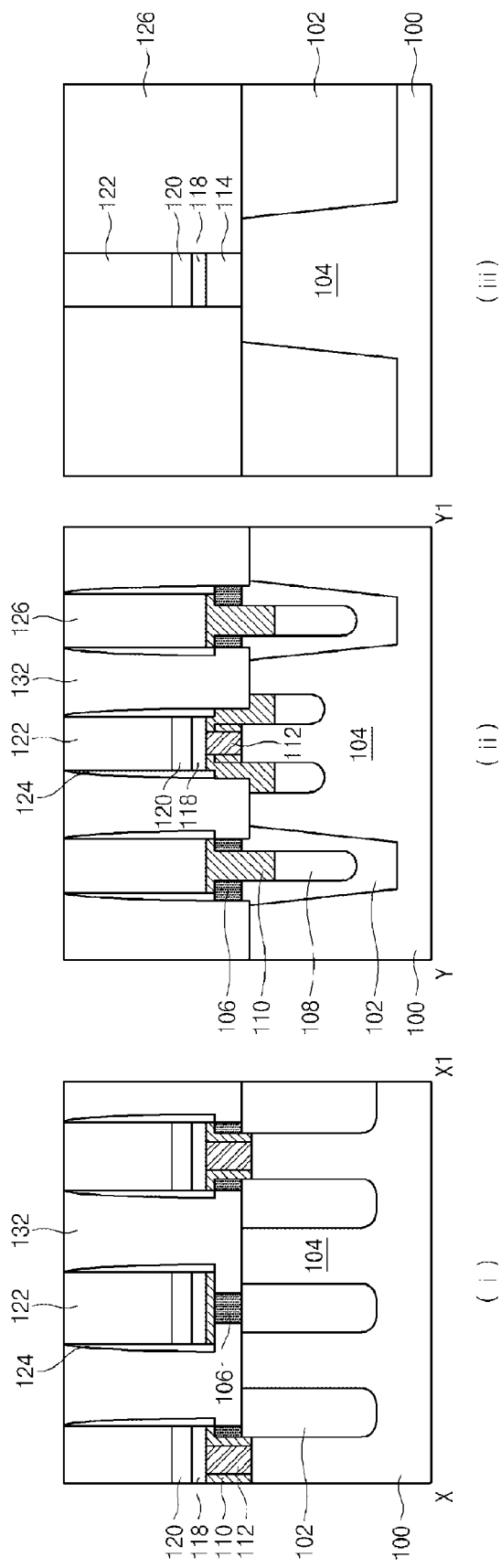

FIG. 1 is a plan view illustrating a cell area of a semiconductor device according to an embodiment of the present invention. FIGS. 2(i) to 2(iii) are cross-sectional views illustrating a semiconductor device according to an embodiment of the present invention, respectively. FIG. 2(i) is a cross-sectional view illustrating a cell area taken along the line x-x' of FIG. 1, FIG. 2(ii) is a cross-sectional view illustrating a cell area taken along the line y-y' of FIG. 1, and FIG. 2(iii) is a cross-sectional view illustrating a peripheral area. FIGS. 3a to 3h are cross-sectional views illustrating a method for forming a semiconductor device according to the embodiment of the present invention. Each of FIG. (i) is a cross-sectional view illustrating a cell area taken along the line x-x' of FIG. 1, each of FIG. (ii) is a cross-sectional view illustrating a cell area taken along the line y-y' of FIG. 1, and each of FIG. (iii) is a cross-sectional view illustrating a peripheral area of FIG. 1.

As shown in FIGS. 2(i) to 2(iii), the semiconductor device according to an embodiment of the present invention includes a bit line 122 formed on a semiconductor substrate 100 over which an active region 104 defined by a device isolation layer 102 is formed, a pad oxide layer 106 formed under the bit line contact, and a nitride layer 110 formed over the pad oxide layer 106. In addition, a spacer 124 is located at both sides of the bit line, and a storage electrode contact 132 connected to the semiconductor substrate 100 is located at both sides of the spacer 124. In this case, a lower part of the storage electrode contact 132 is extended to the pad oxide layer 106 located under the bit line contact. Preferably, the pad oxide layer 106 may have a thickness of 500 Å to 700 Å and the nitride layer 110 may have a thickness of 150 Å to 250 Å. According to this embodiment, the accumulated layer of the pad oxide layer 106 and the nitride layer 110 is formed to have the same thickness as a conventional interlayer insulating layer defining the bit line contact so as to replace the conventional interlayer insulating layer. In addition, a lower part of the pad oxide layer 106 is easily extended in a subsequent process in which a storage electrode contact hole for defining the storage electrode contact is formed.

As described above, the semiconductor device according to an embodiment of the present invention needs not separately form an interlayer insulating layer on the semiconductor substrate. In addition, the above-mentioned semiconductor device can easily extend a lower part of the storage electrode contact connected to the semiconductor substrate, so that it can prevent resistance of the storage electrode contact from being increased.

Referring to FIG. 3a, a pad oxide layer 106, a hard mask layer (not shown), and a silicon nitride layer (not shown) are formed on the semiconductor substrate 100 including the active region 104 defined by the device isolation layer 102. The pad oxide layer 106 may have a thickness of 500 Å to 700 Å. Preferably, the pad oxide layer 106 may have a thickness that corresponds to about 10 times as high as a conventional pad oxide layer. The pad oxide layer 106 is used as a barrier for forming a recess on a semiconductor substrate, and then the pad oxide layer 106 remains rather than being removed. The pad oxide layer 106 is used as an interlayer insulating layer in a subsequent process for forming the nitride layer 110 and the bit line contact. Therefore, the process for forming the interlayer insulating layer defining the bit line contact may be omitted. Also, the pad oxide layer 106 easily exposes the semiconductor substrate using an etching process for defining the storage electrode contact hole, so that it prevents resistance of the storage electrode contact from being increased.

Then, a photoresist pattern for defining a buried-gate area is formed on the pad oxide layer 106, and the pad oxide layer 106 and the semiconductor substrate 100 are etched using the photoresist pattern as an etch mask, so that a recess (not shown) is formed. Thereafter, it is preferable that an oxide layer (not shown) be formed on a surface of the recess. A gate electrode is formed in such a manner that the recess (not shown) is buried, and an etch-back process is performed on the gate electrode in such a manner that the oxide layer of the recess surface is partially exposed, so that a buried gate 108 is formed. The buried gate 108 may be formed of tungsten having low resistance. Then, the nitride layer 110 is formed over the entire upper surface including the buried gate 108. At this time, the nitride layer 110 may be used to prevent the buried gate 108 from being oxidized, and may have a thickness of 150 Å to 250 Å preferably.

Referring to FIG. 3b, a photoresist pattern (not shown) for defining a bit line contact is formed over the nitride layer 110, and the nitride layer 110 is etched using the photoresist pattern as an etch mask, so that a bit line contact hole (not shown) is defined. Then, a spacer is formed at sidewalls of the bit line contact hole (not shown). Preferably, the spacer is formed of a nitride layer. Namely, the spacer can be formed of the same material as the nitride layer 110. Therefore, for convenience of description, the spacer will also be denoted by the nitride layer 110 hereinafter. A conductive material 112 for the bit line contact is formed over the entire upper surface including the bit line contact hole (not shown). Preferably, the conductive material 112 for the bit line contact may be formed of polysilicon. As such, a separate step for forming the interlayer insulating layer which is required according to the conventional art is omitted. That is, the pad oxide layer 106 formed thicker than that of the conventional pad oxide layer replaces the conventional interlayer insulating layer which is used for forming the bit line contact, resulting in a reduction in fabrication time.

Referring to FIG. 3c, a photoresist pattern (not shown) for exposing a peripheral area (iii) is formed on the entire upper surface of the conductive material (polysilicon layer) 112. The polysilicon layer 112, the nitride layer 110, and the pad oxide layer 106 located in the peripheral area are removed using the photoresist pattern (not shown) as an etch mask to expose the semiconductor substrate 100. The above-mentioned removing process of the polysilicon layer 112, the nitride layer 110, and the pad oxide layer 106 may be performed in the process for removing constituent components placed on the semiconductor substrate 100 for performing ion implangtation process in the peripheral area. Thereafter, it is preferable that the ion implantation be performed in the peripheral area (iii) (not shown in drawings).

Referring to FIG. 3d, a polysilicon layer 114 is formed on the entire upper surface. The polysilicon layer 114 functions as a gate in the peripheral area (iii). The polysilicon layer 114 is formed over the semiconductor substrate 110 in the peripheral area (iii), and is formed over the nitride layer 110 in the cell areas (i) and (ii). Therefore, a difference in height (i.e., a step difference) occurs between a cell area (i) or (ii) and a peripheral area (iii). Accordingly, the polysilicon layer 114 is planarized or polished to expose the nitride layer 110 of each cell area (i) or (ii) so that the step difference between each cell area (i) or (ii) and the peripheral area (iii) is adjusted. At this time, the planarization process is performed and at the same time the bit line contact 112 is formed.

Figure 3E:
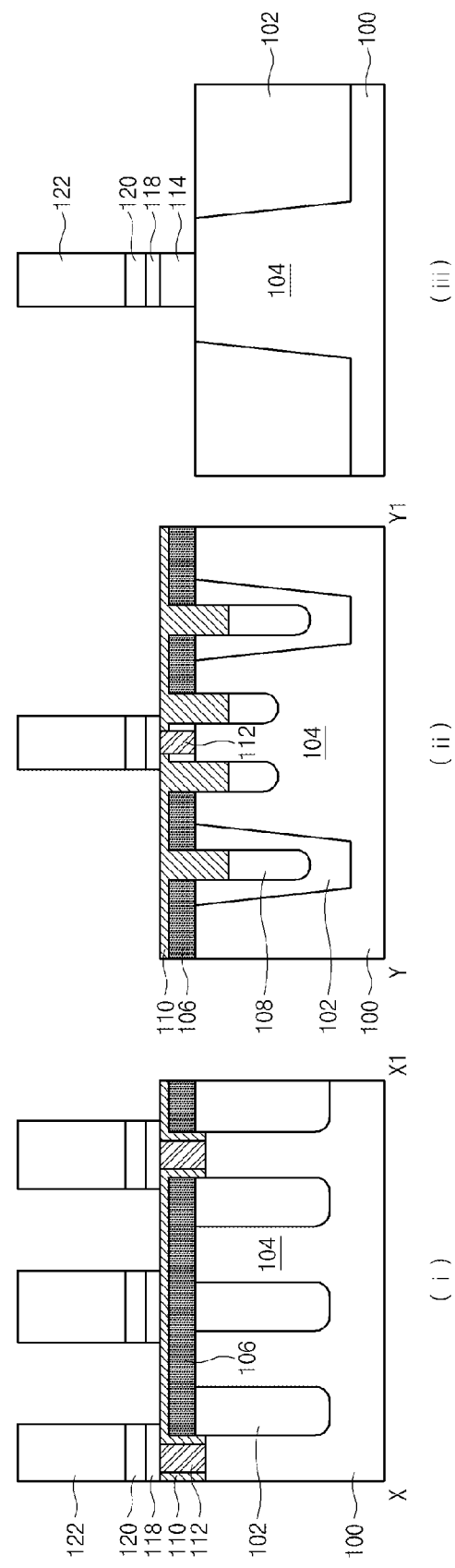

Referring to FIG. 3e, a conductive layer 118, a nitride layer 120, and a hard mask layer 122 are formed over the entire upper surface. Then, in the cell area (i) or (ii), the hard mask layer 122, the nitride layer 120, and the conductive layer 118 are patterned using the photoresist pattern (not shown) defining a bit line as an etch mask, so that the bit line is formed. In the peri area (iii), the hard mask layer 122, the nitride layer 120, the conductive layer 118, and the polysilicon layer 114 are patterned using a photoresist pattern (not shown) defining a gate as an etch mask, so that a gate line is formed. Thereafter, ion implantation for defining a source/drain region is performed at the both sides of the gate (not shown in drawings) in the peripheral area.

Figure 3F:
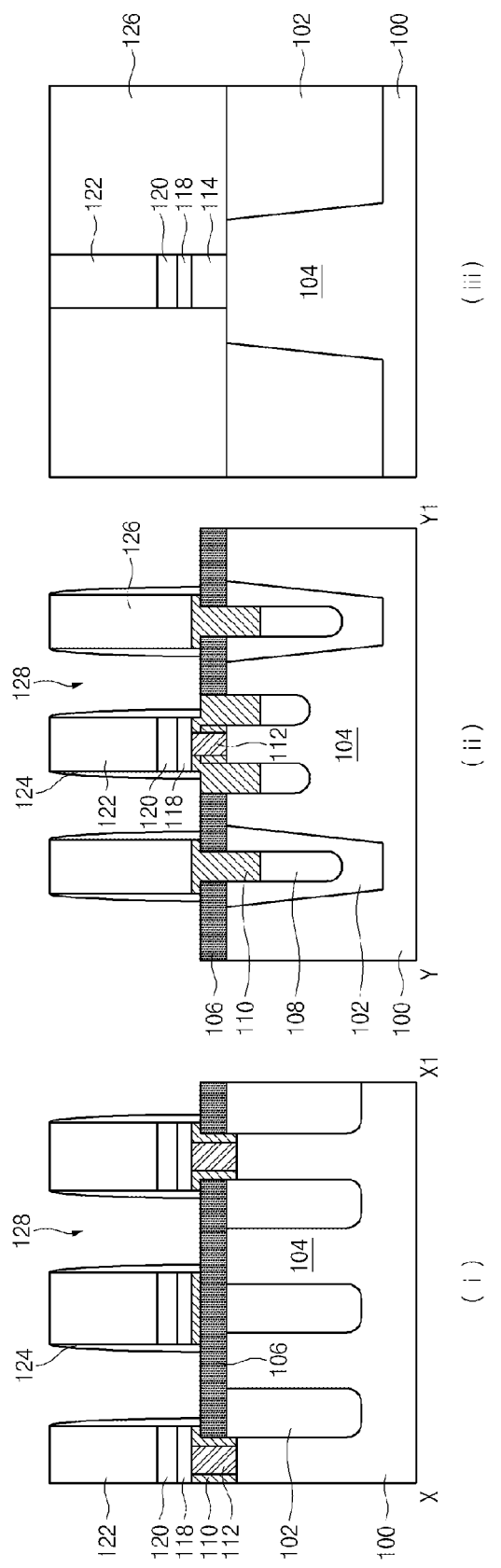

Referring to FIG. 3f, after the interlayer insulating layer 126 is formed on the entire upper surface, a planarization process for exposing the hard mask layer 122 is performed on the interlayer insulating layer 126. It is preferable that the interlayer insulating layer 126 be formed of borophosphosilicate glass (BPSG). Thereafter, a photoresist pattern (not shown) for defining the storage electrode contact hole is formed on the interlayer insulating layer 126. The interlayer insulating layer 126 and the nitride layer 110 are patterned using the photoresist pattern (not shown) as an etch mask to expose the pad oxide layer 106, so that the first storage electrode contact hole 128 is formed. Then, a spacer nitride layer (not shown) is formed over the entire upper surface including the first storage electrode contact hole 128, and is then etched back, so that the spacer 124 is formed at sidewalls of the first storage electrode contact hole 128. When the pad oxide layer 106 under the first storage electrode contact hole 128 is patterned in the subsequent step, the spacer 124 is used as a barrier for preventing the interlayer insulating layer 126 from being attacked.

Figure 3G:
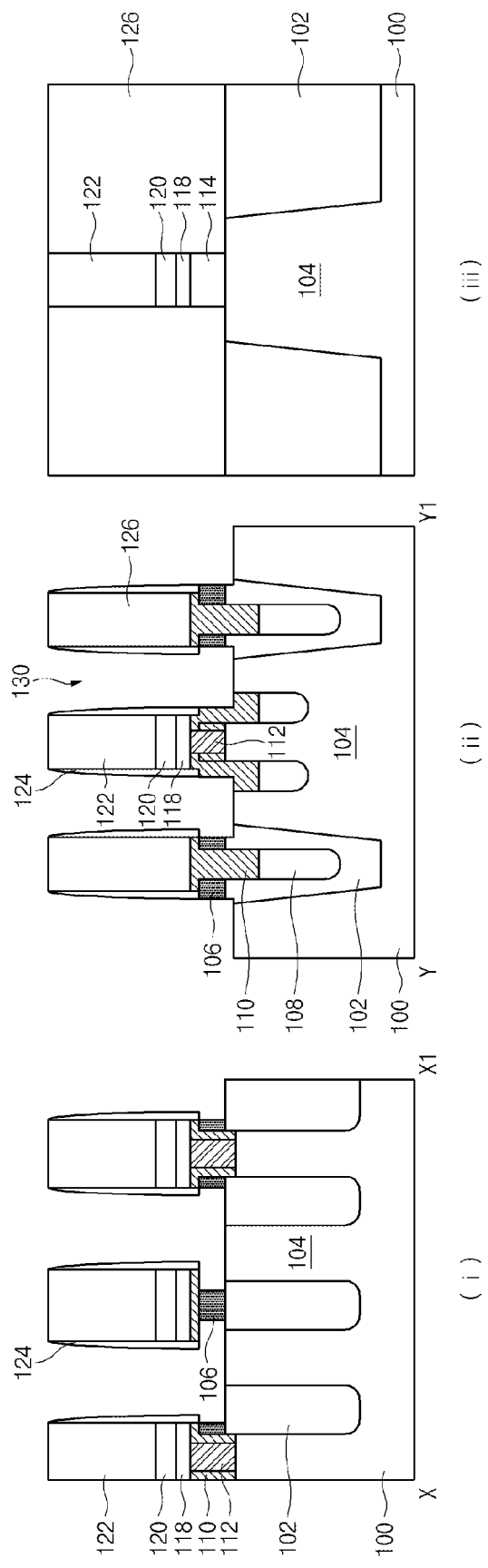

Referring to FIG. 3g, the pad oxide layer 106 under the first storage electrode contact hole 128 is patterned to expose the substrate so that a second storage electrode contact hole 130 is formed. It is preferable that the pad oxide layer 106 be patterned using a wet etch technique. The etching process onto the pad oxide layer 106 is performed not only in the vertical direction but also in the lateral direction by attacking the pad oxide layer 106 located under the interlayer insulating layer 126, so that a lower part of the second storage electrode contact hole 130 can extend laterally and thus secure a wide contact area on the substrate. As a result, the problem of a conventional technique, that is, a narrow storage contact area problem and a contact failure between the source region and the storage electrode contact can be solved. In addition, since a lower part of the storage electrode contact hole defines a wide contact area with the source region on the substrate, resistance of the storage electrode contact can be significantly reduced.

Figure 3H:
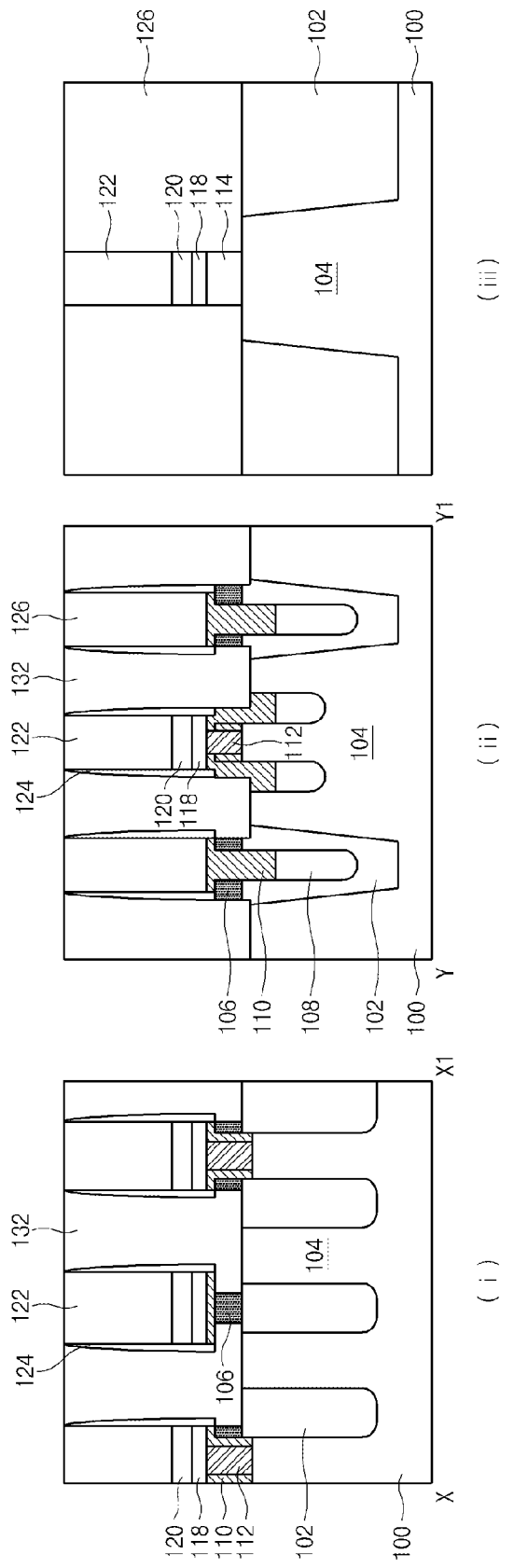

Referring to FIG. 3h, a conductive material over the entire upper surface with filing in the second storage electrode contact hole 130, and is planarized to expose the hard mask layer 122, so that the storage electrode contact 132 is formed.

As apparent from the above description, the present invention increases the size of contact area between a storage electrode contact and a source region in an active region of the substrate without an additional mask process, resulting in a reduction in cell resistance and a reduction of process time. The present invention solves the conventional problems that the storage electrode contact hole was not opened, or partially opened, causing resistance of the storage electrode contact increased. In addition, the present invention need not separately form the interlayer insulating layer for forming the bit line contact, resulting in a reduction in fabrication time.

The above embodiments of the present invention are illustrative and not limitative. Various alternatives and equivalents are possible. The invention is not limited by the type of deposition, etching polishing, and patterning steps described herein. Nor is the invention limited to any specific type of semiconductor device. For example, the present invention may be implemented in a dynamic random access memory (DRAM) device or non volatile memory device. Other additions, subtractions, or modifications are obvious in view of the present disclosure and are intended to fall within the scope of the appended claims.

What is claimed is:

1. A method for forming a semiconductor device comprising:
   forming a pad insulating layer over a semiconductor substrate;
   forming a recess by etching the pad insulating layer and the semiconductor substrate;
   forming a gate in the recess;
   forming an insulating layer over the gate in the recess and over the pad insulating layer;
   forming a bit line contact hole by etching the insulating layer and the pad insulating layer to expose the semiconductor substrate;
   forming a bit line contact by filling the bit line contact hole with a conductive material, wherein an upper surface of the insulating layer formed over the pad insulating layer and an upper surface of the bit line contact are disposed at substantially the same level;
   forming a bit line coupled to the bit line contact; and
   forming a storage electrode contact hole by etching the insulating layer and the pad insulating layer to expose the semiconductor substrate.

2. The method according to claim 1, wherein the insulating layer includes a nitride layer having a thickness of 150 Å to 250 Å.

3. The method according to claim 1, wherein the forming of the bit line includes:
   forming a conductive layer, a nitride layer, and a hard mask layer over the insulating layer;
   forming a photoresist pattern to define the bit line over the hard mask layer; and
   patterning the hard mask layer, the nitride layer, and the conductive layer using the photoresist pattern as an etch mask to expose the insulating layer.

4. The method according to claim 1, wherein the forming of the storage electrode contact hole includes:
   forming a spacer over a sidewall of the insulating layer and over a sidewall of the bit line; and
   etching the pad insulating layer using the spacer as an etch mask to expose the semiconductor substrate.

5. The method according to claim 4, wherein the etching of the pad insulating layer includes a wet etching method.

6. The method according to claim 4, wherein the forming the spacer comprises:
   forming a spacer material over the insulating layer and the bit line; and
   performing an etch-back process on the spacer material.

7. The method according to claim 1, the method further comprising:
   filling the storage electrode contact hole with a conductive material to form a storage electrode contact.

* * * * *